(12) United States Patent
Liu et al.

(10) Patent No.: US 11,798,802 B2
(45) Date of Patent: Oct. 24, 2023

(54) METHODS FOR STRIPPING AND CLEANING SEMICONDUCTOR STRUCTURES

(71) Applicant: GlobalWafers Co., Ltd., Hsinchu (TW)

(72) Inventors: Qingmin Liu, Glen Carbon, IL (US); Haihe Liang, St. Peters, MO (US); Junting Yang, Beijing (CN)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/670,167

(22) Filed: Feb. 11, 2022

(65) Prior Publication Data

US 2023/0260779 A1 Aug. 17, 2023

(51) Int. Cl.
| | |
|---|---|
| *H01L 21/02* | (2006.01) |
| *B08B 3/08* | (2006.01) |
| *C11D 3/04* | (2006.01) |
| *C11D 11/00* | (2006.01) |
| *C11D 1/72* | (2006.01) |
| *F26B 21/14* | (2006.01) |

(52) U.S. Cl.
CPC .......... *H01L 21/02082* (2013.01); *B08B 3/08* (2013.01); *C11D 1/72* (2013.01); *C11D 3/042* (2013.01); *C11D 11/0047* (2013.01); *F26B 21/14* (2013.01)

(58) Field of Classification Search
CPC ....... H01L 21/02082; B08B 3/08; C11D 1/72; C11D 3/042; C11D 11/0047; F26B 21/14
See application file for complete search history.

(56) References Cited

U.S. PATENT DOCUMENTS

| | | | |
|---|---|---|---|
| 7,927,972 B2 | 4/2011 | Endo et al. | |
| 2006/0054181 A1* | 3/2006 | Rayandayan | C11D 7/265 |
| | | | 257/E21.228 |
| 2007/0049056 A1* | 3/2007 | Pagliaro, Jr. | H01L 21/02052 |
| | | | 438/787 |
| 2012/0193753 A1* | 8/2012 | Grabbe | H01L 21/76251 |
| | | | 257/E21.24 |
| 2015/0357180 A1 | 12/2015 | Kweskin et al. | |
| 2020/0083065 A1 | 3/2020 | Viravaux et al. | |
| 2021/0183692 A1 | 6/2021 | Lottes et al. | |

FOREIGN PATENT DOCUMENTS

| | | |
|---|---|---|
| CN | 1319131 C | 5/2007 |
| EP | 1421609 B1 | 5/2004 |
| JP | 2002329691 A | 11/2002 |
| JP | 2005217312 A | 8/2005 |

* cited by examiner

*Primary Examiner* — Erin F Bergner
(74) *Attorney, Agent, or Firm* — Armstrong Teasdale LLP

(57) ABSTRACT

Methods for removing an oxide film and for cleaning silicon-on-insulator structures are disclosed. The methods may involve immersing the silicon-on-insulator structure in a stripping bath to strip an oxide film from the surface of the silicon-on-insulator structure. The stripped silicon-on-insulator structure is immersed in an ozone bath comprising ozone. The ozone-treated silicon-on-insulator structure may be immersed in an SC-1 bath comprising ammonium hydroxide and hydrogen peroxide to clean the structure.

13 Claims, 7 Drawing Sheets

METHODS FOR STRIPPING AND CLEANING SEMICONDUCTOR STRUCTURES

FIELD OF THE DISCLOSURE

The field of the disclosure relates to methods for removing an oxide from a silicon-on-insulator (SOI) structure and for cleaning such a structure.

BACKGROUND

Semiconductor structures such as silicon-on-insulator structures ("SOI" structures) may be subjected to an anneal before downstream processing. This anneal may cause an oxide ($SiO_2$) to form on the surfaces of the SOI structure. This oxide is typically removed from the top surface of the structure. Upon cleaning the structure after the oxide is removed, some areas on the surface of the silicon-on-insulator structure form raised projections or "bumps" of the wafer surface. Previous attempts to remove the projections such as by increasing the time of the stripping process have not been successful in eliminating the projections from forming.

A need exists for methods for removing the oxide on the top surface of the SOI structure and for cleaning the structure that reduce or eliminate raised projections from the surface of the SOI structure.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for stripping and cleaning a surface of a silicon-on-insulator structure. The silicon-on-insulator structure includes a handle structure, a silicon top layer and a dielectric layer disposed between the handle structure and the silicon top layer. The silicon-on-insulator structure has an oxide film on a top surface of the silicon-on-insulator structure. The silicon-on-insulator structure is immersed in a stripping bath to strip the oxide film from the surface of the silicon-on-insulator structure and prepare a stripped silicon-on-insulator structure. The stripping bath includes hydrofluoric acid and a surfactant. The stripped silicon-on-insulator structure is immersed in an ozone bath comprising ozone to prepare an ozone-treated silicon-on-insulator structure. The ozone-treated silicon-on-insulator structure is immersed in an SC-1 bath comprising ammonium hydroxide and hydrogen peroxide to prepare a SC-1 treated silicon-on-insulator structure.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for stripping and cleaning a surface of a semiconductor structure. In some embodiments, an oxide (e.g., $SiO_2$) is removed the surface of the semiconductor structure by immersing the structure in a stripping bath comprising hydrofluoric acid and a surfactant. After stripping, the semiconductor structure is immersed in a bath comprising ozone to remove defects (e.g., nano-scale defects) before subsequent cleaning operations to prevent the defects from acting as an etch mask thereby forming projections on the surface of the semiconductor structure.

The methods may generally be applicable to remove oxides from any semiconductor structure (e.g., single layer or bonded structures) such as any bonded wafer structure in which it is desirable to remove an oxide film. The semiconductor structures that are cleaned according to embodiments of the present disclosure have a front surface, a back surface, a circumferential edge and a central axis. The semiconductor structure may be any diameter suitable for use by those of skill in the art including, for example, about 200 mm, about 300 mm, greater than about 300 mm or even about 450 mm diameter substrates.

In some embodiments, the structure that is processed may be a silicon-on-insulator structure. Such structures may include a handle wafer, a silicon layer (sometimes referred to as a "silicon device layer" or "silicon top layer") and a dielectric layer disposed between the handle wafer and silicon layer. The following is merely one example of methods for preparing a silicon-on-insulator structure and other methods may be used unless stated otherwise.

Figure 1:
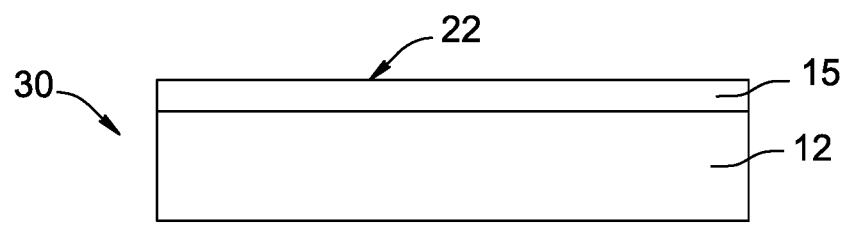
FIG. 1 is a cross-section view of a donor structure having a donor wafer with a dielectric layer thereon.

An example of a donor structure 30 that may be bonded to a handle structure to form a bonded wafer structure is shown in FIG. 1. The donor structure 30 may be formed with a dielectric layer 15 deposited on the front surface of a donor wafer 12. It should be understood that, alternatively, the dielectric layer 15 may be grown or deposited on the handle wafer or a dielectric layer may be grown on both the donor wafer and handle wafer and that these structures may be bonded in any of the various arrangements without limitation. Suitable donor wafers 12 may be composed of silicon, germanium, silicon germanium, gallium nitride, aluminum nitride, gallium arsenide, indium gallium arsenide and any combination thereof. In some embodiments, the donor wafer is composed of single crystal silicon.

The dielectric layer 15 may be any electrically insulating material suitable for use in a SOI structure, such as a material comprising $SiO_2$, $Si_3N_4$, aluminum oxide, or magnesium oxide. In some embodiments, the dielectric layer 15 is $SiO_2$ (i.e., the dielectric layer consists essentially of $SiO_2$). In embodiments in which the dielectric layer is silica ($SiO_2$), the dielectric layer is sometimes referred to as a "buried oxide" or "BOX" layer 15. The dielectric layer 15 may be applied according to any known technique in the art, such as thermal oxidation, wet oxidation, thermal nitridation or a combination of these techniques.

Figure 2:
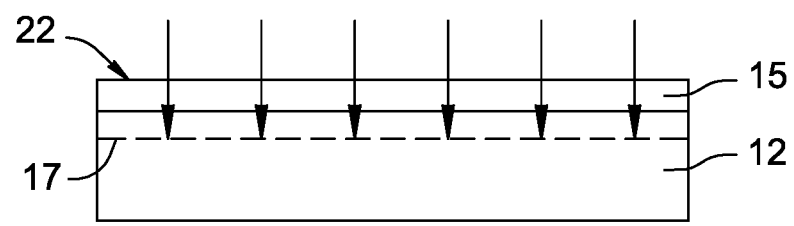
FIG. 2 is cross-section view of the donor structure during ion implantation.

As shown for example in FIG. 2, ions (e.g., hydrogen atoms, helium atoms or a combination of hydrogen and helium atoms) may be implanted at a substantially uniform specified depth beneath the front surface 22 of the donor structure to define a cleave plane 17. It should be noted, that when helium and hydrogen ions are co-implanted into the structure to form the cleave plane 17, they may be implanted concurrently or sequentially. In some embodiments, ions are implanted prior to deposition of the dielectric layer 15. When implantation is performed prior to deposition of the dielectric layer 15, the subsequent growth or deposition of the dielectric layer on the donor wafer 12 is suitably performed at a temperature low enough to prevent premature separation or cleaving along plane 17 in the donor layer (i.e., prior to the wafer bonding process step).

The handle structure 10 (FIG. 3) may include a handle wafer obtained from any suitable material for preparing multi-layered structures, such as silicon, silicon carbide, sapphire, germanium, silicon germanium, gallium nitride, aluminum nitride, gallium arsenide, indium gallium arsenide, quartz and combinations thereof. The handle structure 10 may include a dielectric layer deposited on a handle wafer or, as in other embodiments, consists only of a handle wafer (i.e., does not include a dielectric layer). The handle wafer and donor wafer may be single crystal silicon wafers and may be single crystal silicon wafers which have been sliced from a single crystal ingot grown in accordance with conventional Czochralski crystal growing methods.

Figure 3:
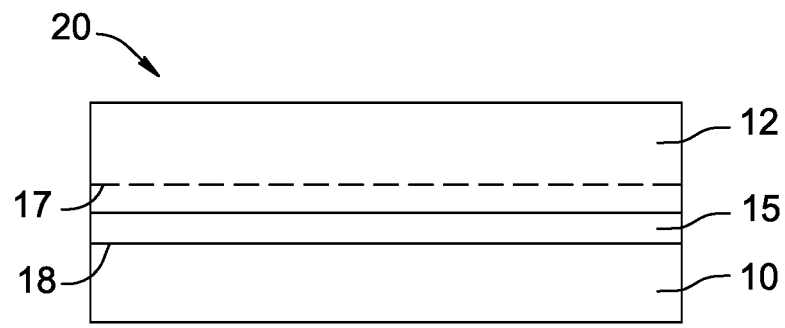
FIG. 3 is a cross-section view of the donor structure bonded to a handle structure.

As shown in FIG. 3, the front surface of the dielectric layer 15 of the donor structure is suitably bonded to the front surface of the handle structure 10 to form a bonded wafer structure 20 through a bonding process. The dielectric layer 15 and handle structure 10 may be bonded together while performing a surface activation by exposing the surfaces of the structures to a plasma containing, for example, oxygen or nitrogen. The wafers are then pressed together and a bond at the bond interface 18 is formed there between. Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer).

Once prepared, the bonded wafer structure 20 is placed in the cleaving device to separate (i.e., cleave) a portion of the donor wafer along the cleave plane from the bonded structure to form the layered semiconductor structure (e.g., SOI structure). Generally speaking, the cleaving device may induce this fracture using techniques known in the art, such as thermally and/or mechanically induced cleaving techniques.

Figure 4:
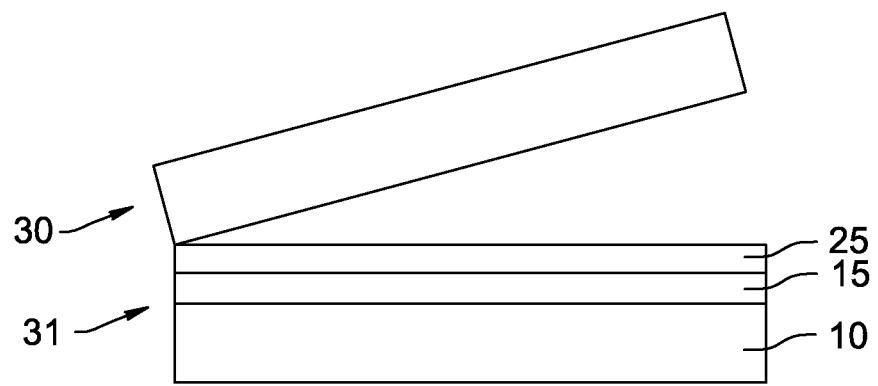
FIG. 4 is a cross-section view of a bonded wafer structure upon cleaving the donor structure at the cleave plane.

Referring to FIG. 4, upon separation, two structures 30, 31 are formed. Because the separation of the bonded wafer structure 20 occurs along the cleave plane 17 in the donor structure 12 (FIG. 3), a portion of the donor structure remains part of both structures (i.e., a portion of the donor wafer is transferred along with the dielectric layer 15). Structure 30 comprises a portion of the donor wafer. Structure 31 is the SOI structure and includes a handle structure 10, dielectric layer 15 and silicon top layer 25 (the portion of the donor wafer remaining after cleaving) disposed atop the dielectric layer 15. In embodiments in which the donor structure and handle structure both include a dielectric layer, the dielectric layers combine to form the dielectric layer 15 of the SOI structure.

The cleaving device used to separate the bonded wafer structure along the cleave plane may be a mechanical cleaving device in which separation is induced or achieved by means of mechanical force, either alone or in addition to annealing. For instance, the bonded structure may be placed in a fixture in which mechanical force is applied perpendicular to the opposing sides of the bonded structure in order to pull a portion of the donor structure apart from the bonded structure.

An example cleaving device includes suction cups that apply mechanical force near a leading cleave edge of the bonded wafer structure 20. The separation of the portion of the donor wafer may be initiated by applying a mechanical wedge or blade at the edge of the bonded wafer at the cleave plane 17 in order to initiate propagation of a crack along the cleave plane 17. The mechanical force applied by the suction cups then pulls the portion of the donor structure from the bonded structure, thus forming the SOI structure. Mechanical cleaving devices are commercially available such as the Debond & Cleave Tools from Silicon Genesis Corporation (San Jose, Calif.).

In alternative embodiments, the cleaving device is a thermal cleaving device in which fracturing is achieved by annealing the bonded structure. For example, a thermal cleave may be performed at a temperature about 200° C. to about 800° C., or from about 250° C. to about 650° C. for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions. The thermal cleaving device may be a belt furnace in which propagation of the cleave is achieved at the leading edge of the bonded structure (i.e., the leading edge in the direction of travel of the structure through the furnace) and proceeds toward the trailing edge of the bonded wafer structure. Other types of cleaving devices may also be used.

The layers (handle structure 10, dielectric layer 15 and silicon top layer 25) of the SOI structure 31 may generally have any thickness that allows the layers to function as described herein. In some embodiments, the silicon top layer 25 is relatively thin (e.g., thickness of about 0.1 μm to about 0.3 μm) and the dielectric layer 15 is relatively thick (about 1.0 μm or more).

The methods described herein for producing a SOI structure are example methods and other methods may be used without departing from the scope of the present disclosure.

Figure 5:
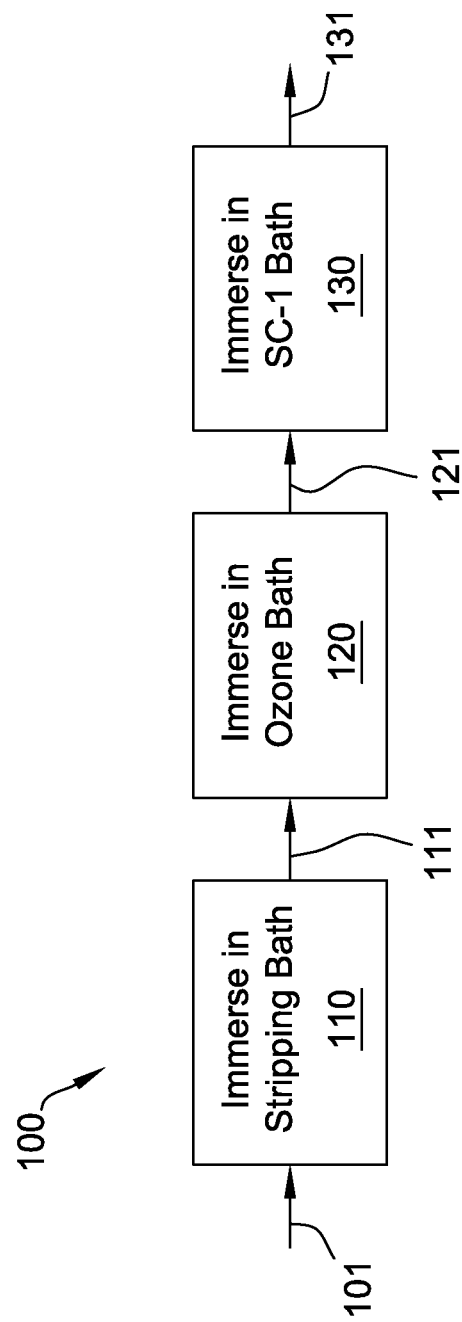
FIG. 5 is a method for removing an oxide and cleaning a silicon-on-insulator structure.

Referring now to FIG. 5, a method 100 of the present disclosure is shown. While the methods of the present disclosure may be described herein with reference to a silicon-on-insulator structure, in some embodiments other semiconductor structures may be processed by the disclosed methods. In a first step 110, the silicon-on-insulator structure 101 is immersed in a stripping bath to remove the oxide (e.g., $SiO_2$) from the top surface of the silicon-on-insulator structure 101 and prepare a stripped silicon-on-insulator structure 112. The stripping bath comprises hydrofluoric acid and a surfactant. In some embodiments, the surfactant is a non-ionic surfactant. In some embodiments, the non-ionic surfactant comprises an ether group. In some embodiments the ether-based surfactant is a polyoxyalkylene alkyl ether. Commercially available ether-based surfactants include TRITON X-Series (Dow Chemical Company (Midland, Mich.)) and NCW1001 and NCW1002 (Wako Chemicals USA (Richmond, Va.)).

In some embodiments, a megasonic acoustic field may be applied to the various cleaning baths describe herein during stripping or cleaning of the semiconductor substrates. Typical frequencies for megasonic cleaning may range from 750 kHz to about 1.5 MHz. Megasonic cleaning causes cavitation which promotes removal of particles from the surface of the substrates. In other embodiments, megasonic acoustic fields are not applied during the various stripping and cleaning steps described herein.

The amount of surfactant in the stripping bath may any effective amount that allows the stripping bath to function as described herein. In some embodiments, the amount of surfactant is at least 0.01 wt % or, as in other embodiments, at least about 0.025 wt %, or at least 0.05 wt %, or from 0.01 wt % to about 0.1 wt %, or from 0.025 wt % to 0.075 wt %. The ratio (v:v) of deionized water to hydrofluoric acid (HF) may be less than 100:1, less than 50:1, less than 25:1, at least 1:1, at least 5:1, from 1:1 to 100:1 or from 1:1 to 25:1. The period of time at which the silicon-on-insulator structure is immersed in the stripping bath may be at least 5 minutes, at least 10 minutes, or from 5 minutes to about 60 minutes, or from about 5 minutes to about 30 minutes. In some embodiments, the stripping bath does not include acetic acid.

The stripping bath (and additional baths referenced below) may be held by any suitable container such as a container that is part of a wet immersion station apparatus. An example of such a system is the GAMA Automated Wet Station available from Naura-Akrion (Allentown, Pa.) which may include a plurality of containers for immersing the structures in different baths. A plurality of semiconductor structures (e.g., at least 5, 10, 25, or 50 or more) may be loaded onto a wafer carrier (or "cassette" or "boat") and one or more of the carriers may be immersed into the bath which is held within the container. The components used to secure the structures in the bath are typically high-purity parts such as PTFE, quartz or coated aluminum or stainless steel. Commercially available cleaning apparatus may be purchased from Echo Giken Co., LTD (Tokyo, Japan) and Akrion Systems LLC (Allentown, Pa.). In other embodiments, the structures may be immersed in the bath in a "cassette-less" system.

In accordance with embodiments of the present disclosure, "immersing" the silicon-on-insulator structure in the stripping bath or the other baths described below involves fully immersing the silicon-on-insulator structure in the bath. Generally and according to embodiments of the present disclosure, the substrates are not spun during cleaning in such immersion processes.

In a second step 120 of the method, the stripped silicon-on-insulator structure 111 is immersed in an ozone bath to prepare an ozone-treated silicon-on-insulator structure 121. The ozone bath comprises ozone ($O_3$). In some embodiments, the concentration of ozone in the ozone bath is at least 5 ppm, or at least 10 ppm, at least 20 ppm, or from 5 ppm to 40 ppm. The stripped silicon-on-insulator structure 111 may be immersed in the ozone bath for at least 1 minute, at least 5 minutes, or at least 10 minutes (e.g., from 1 minute to 30 minutes or from 5 minutes to about 20 minutes).

In a third step 130, the ozone-treated silicon-on-insulator structure 121 is immersed in an SC-1 bath to prepare a SC-1 treated silicon-on-insulator structure 131. "SC-1" baths are aqueous cleaning baths known to those of skill in the art and may also be referred to as "Standard Clean-1" or "RCA-1" baths.

The SC-1 bath comprises ammonium hydroxide ($NH_4OH$) and hydrogen peroxide ($H_2O_2$). The amount of ammonium hydroxide in the SC-1 bath may be at least 0.1 wt %, at least 0.5 wt %, or at least 1.0 wt % (e.g., from 0.1 wt % to 5 wt % or from 1 wt % to 3 wt %). The amount of hydrogen peroxide in the SC-1 bath may be at least 0.5 wt %, at least 1 wt %, at least 2 wt %, from 0.5 wt % to 10 wt %, or from 2% wt % to about 5 wt %.

Figure 6:
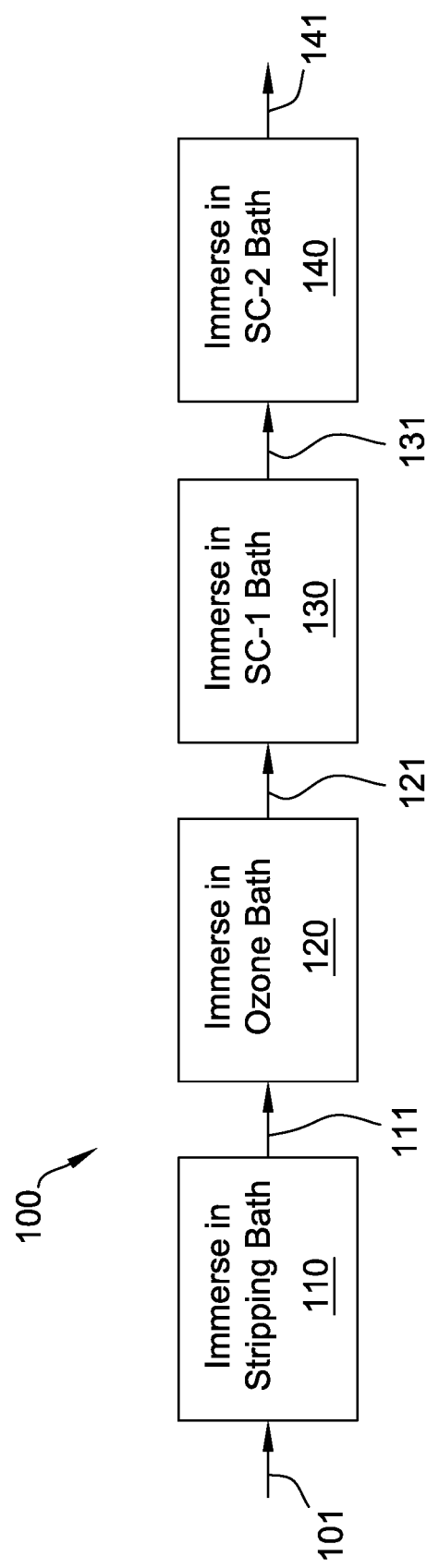
FIG. 6 is another embodiment of a method for removing an oxide and cleaning a silicon-on-insulator structure.

In another embodiment of the method and as shown in FIG. 6, after immersion in the SC-1 bath, the SC-1 treated silicon-on-insulator structure 131 is immersed in a SC-2 bath to form a SC-2 treated silicon-on-insulator structure 141. "SC-2" baths are aqueous cleaning baths known to those of skill in the art and may also be referred to as "Standard Clean-2" or "RCA-2" baths. SC-2 baths comprise hydrochloric acid (HCl). In some embodiments, the SC-2 bath comprises at least 0.01 wt % hydrochloric acid, at least 0.1 wt % hydrochloric acid, at least 0.25 wt % hydrochloric acid, from 0.01 wt % to 5 wt % hydrochloric acid, or from 0.1 wt % to 5 wt % hydrochloric acid. The silicon-on-insulator structure may be immersed in the SC-2 bath for at least 5 minutes, at least 7.5 minutes, or from 5 minutes to 20 minutes.

Figure 7:
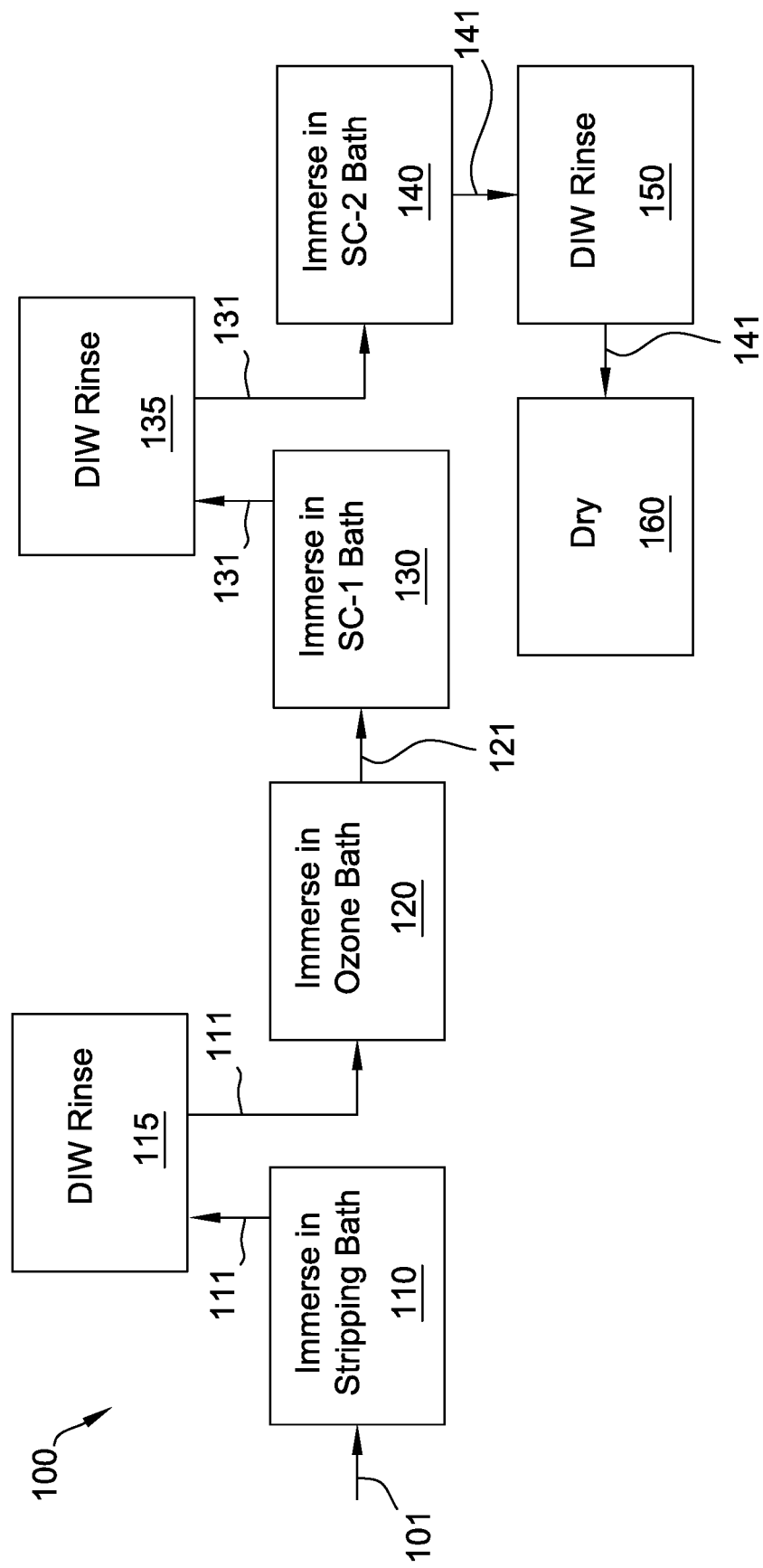
FIG. 7 is another embodiment of a method for removing an oxide and cleaning a silicon-on-insulator structure.

Another embodiment of the method for stripping and cleaning a surface of a silicon-on-insulator structure is shown in FIG. 7. The stripped silicon-on-insulator structure 111 (i.e., the structure after being immersed in the stripping bath in step 110), is rinsed in a rinsing step 115 in which the structure is contacted with deionized water (DIW) such as by immersion in deionized water. In a second rinsing step 135, the SC-1 treated silicon-on-insulator structure 131 is rinsed with DIW water. The SC-2 treated structure 141 may undergo a third rinsing step 150 such as by contacting the structure 141 with DIW (e.g., immersion). The rinsed silicon-on-insulator structure may be dried in drying step 160. For example, the structure may be dried in an iso-propyl alcohol vapor (IPA) dryer (Marangoni drying).

The various baths described herein may be at room temperature (about 25° C.). In other embodiments, a heated bath is used (e.g., at least 30° C., at least 40° C., at least 60° C., from 30° C. to 95° C. or from 30° C. to 80° C.)

The methods for stripping and cleaning a surface of a silicon-on-insulator structure described above and shown in FIGS. 5-7 are exemplary and additional steps may be included, or the various steps may be re-ordered or one or more steps may be eliminated.

Compared to conventional methods for removing an oxide from a silicon-on-insulator structure, the methods of the present disclosure have several advantages. Without being bound to any particular theory, it is believed that the surfactant used during oxide stripping causes nano-sized defects to form on the surface of the silico-on-insulator structure. The nano-sized defects may be surfactant or surfactant-bound contaminants. The defects are nano-sized and are not detectable by conventional wafer inspection tools (e.g., KLA-Tencor Surfscan SPx Wafer Surface Analysis System). The defects are believed to act as an etch mask during subsequent cleaning steps (SC-1 clean). An ozone treatment has been found to remove the defects prior to the cleaning process which reduces or eliminates the raised projections from the surface of the SOI structure.

EXAMPLES

The processes of the present disclosure are further illustrated by the following Examples. These Examples should not be viewed in a limiting sense.

Example 1: Raised Projections on SOI Surface Under Conventional Methods

Figure 8:
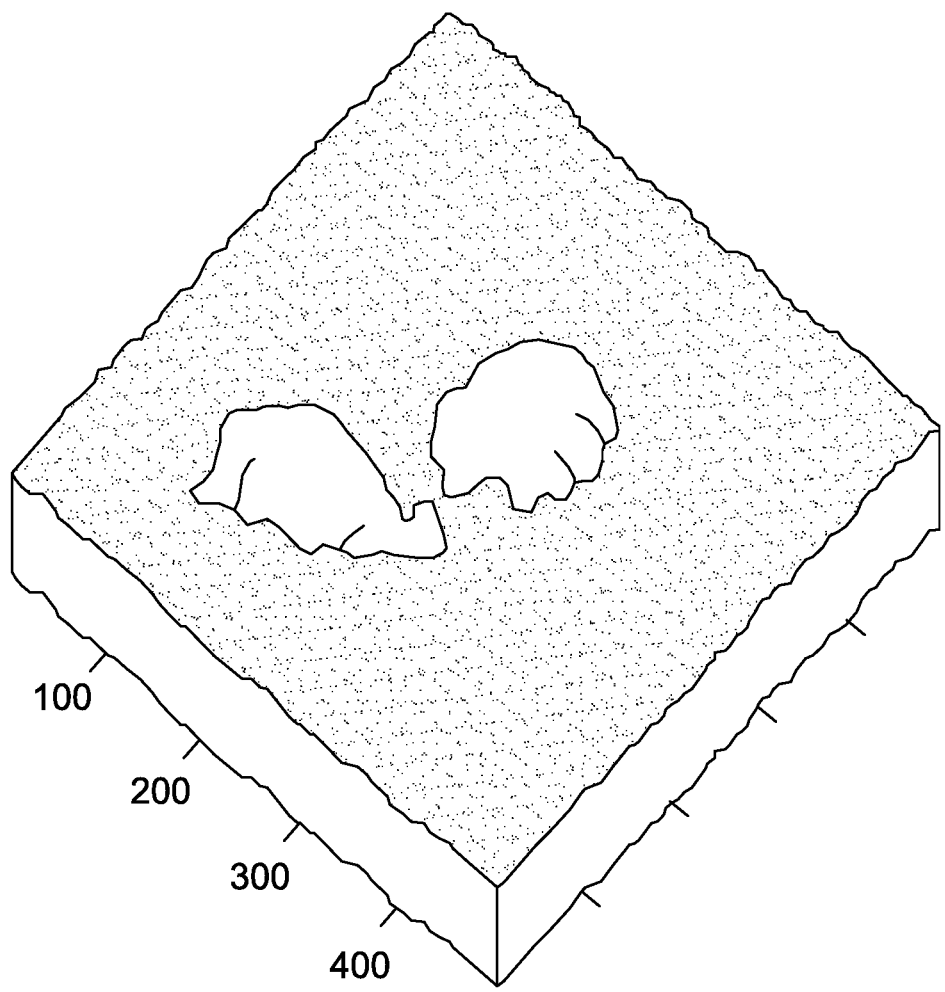
FIG. 8 is a reproduction of an AFM image of a nano-sized defect formed in a conventional method for removing an oxide and cleaning a silicon-on-insulator structure.
Figure 9:
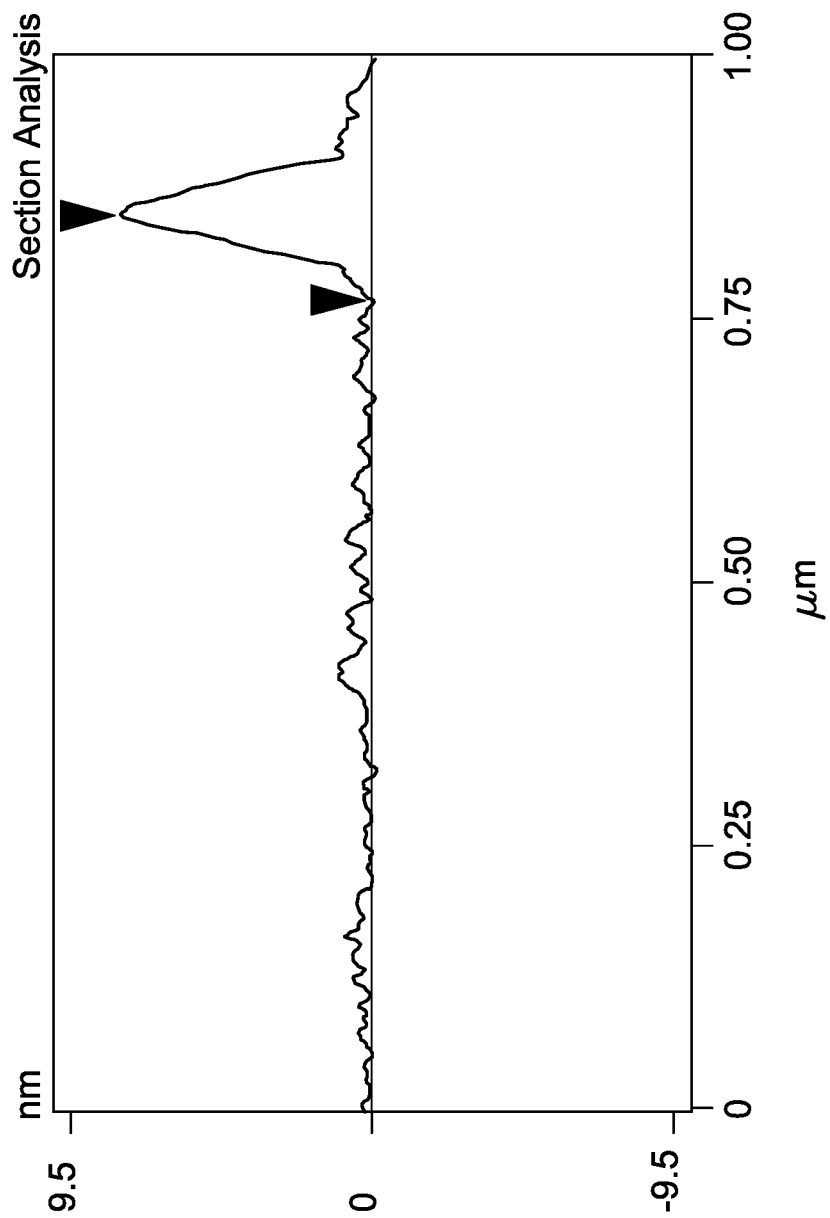
FIG. 9 is a graph showing the height of the defect shown in FIG. 8.

A 200 mm SOI structure was fabricated by the method described herein. The SOI structure was annealed to form an oxide ($SiO_2$) on the top surface of the silicon device layer of the SOI structure. The structure was immersed in a HF bath with surfactant, DIW rinsed and immersed in a SC-1 bath. FIG. 8 is a reproduction of an AFM image of the SOI structure which shows nano-scale raised projections on the surface of the structure. FIG. 9 is an AFM graph showing the height of the raised projections. When a 200 mm SOI structure having an oxide ($SiO_2$) on the top surface of the silicon device layer of the SOI structure was immersed in an ozone bath before the SC-1 clean, AFM images showed that the defects were eliminated.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for stripping and cleaning a surface of a silicon-on-insulator structure, the silicon-on-insulator structure comprising a handle structure, a silicon top layer and a dielectric layer disposed between the handle structure and the silicon top layer, the silicon-on-insulator structure having an oxide film on a top surface of the silicon-on-insulator structure, the method comprising:
    immersing the silicon-on-insulator structure in a stripping bath to strip the oxide film from the surface of the silicon-on-insulator structure and prepare a stripped silicon-on-insulator structure, the stripping bath comprising hydrofluoric acid and a surfactant;
    immersing the stripped silicon-on-insulator structure in an ozone bath comprising ozone to prepare an ozone-treated silicon-on-insulator structure; and
    immersing the ozone-treated silicon-on-insulator structure in an SC-1 bath comprising ammonium hydroxide and hydrogen peroxide to prepare a SC-1 treated silicon-on-insulator structure.

2. The method as set forth in claim 1 further comprising immersing the SC-1 treated silicon-on-insulator structure in a SC-2 bath comprising hydrochloric acid to form a SC-2 treated silicon-on-insulator structure.

3. The method as set forth in claim 2 comprising rinsing the SC-1 treated silicon-on-insulator structure with water prior to immersing the SC-1 treated silicon-on-insulator structure in the SC-2 bath.

4. The method as set forth in any claim 2 comprising drying the SC-2 treated silicon-on-insulator structure by contacting the SC-2 treated silicon-on-insulator structure with iso-propyl alcohol vapor.

5. The method as set forth in claim 4 further comprising rinsing the SC-2 treated silicon-on-insulator structure with water prior to drying the SC-2 treated silicon-on-insulator structure.

6. The method as set forth in claim 1 wherein the stripping bath comprises at least about 0.01 wt % surfactant.

7. The method as set forth in claim 1 wherein the surfactant is a non-ionic surfactant.

8. The method as set forth in claim 7 wherein the non-ionic surfactant is an ether-based surfactant comprising an ether group.

9. The method as set forth in claim 8 wherein the ether-based surfactant is a polyoxyalkylene alkyl ether.

10. The method as set forth in claim 1 wherein the ozone bath comprises at least 20 ppm of ozone.

11. The method as set forth in claim 1 wherein the stripped silicon-on-insulator structure is immersed in the ozone bath for at least 5 minutes.

12. The method as set forth in claim 1 wherein the stripped silicon-on-insulator structure is immersed in the ozone bath for between 5 minutes and 20 minutes.

13. The method as set forth in claim 1 wherein the silicon-on-insulator structure is immersed in the stripping bath for at least 5 minutes.

* * * * *